United States Patent
Li

(10) Patent No.: US 11,778,873 B2
(45) Date of Patent: Oct. 3, 2023

(54) ARRAY SUBSTRATE AND DISPLAY PANEL

(71) Applicant: Wuhan China Star Optoelectronics Semiconductor Display Technology Co., Ltd., Hubei (CN)

(72) Inventor: Xue Li, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 381 days.

(21) Appl. No.: 17/058,144

(22) PCT Filed: Jul. 30, 2020

(86) PCT No.: PCT/CN2020/105711
§ 371 (c)(1),
(2) Date: Nov. 24, 2020

(87) PCT Pub. No.: WO2022/000674
PCT Pub. Date: Jan. 6, 2022

(65) Prior Publication Data
US 2022/0190086 A1    Jun. 16, 2022

(30) Foreign Application Priority Data
Jul. 3, 2020   (CN) .......................... 202010631760.8

(51) Int. Cl.
*H10K 59/131*   (2023.01)
*G09F 9/30*   (2006.01)

(52) U.S. Cl.
CPC ........... *H10K 59/131* (2023.02); *G09F 9/301* (2013.01)

(58) Field of Classification Search
CPC ......... H01K 59/131; G09F 9/301; G09F 9/30; G09G 2380/02; H01L 51/0097; H01L 27/3276; H10K 59/131
See application file for complete search history.

(56) References Cited

U.S. PATENT DOCUMENTS

| | | | |
|---|---|---|---|
| 2017/0352717 A1* | 12/2017 | Choi | H01L 27/3276 |
| 2018/0040680 A1 | 2/2018 | Cai | |
| 2019/0221632 A1 | 7/2019 | Tomitani | |
| 2021/0028268 A1* | 1/2021 | Lin | H01L 51/5256 |
| 2021/0142707 A1 | 5/2021 | Zheng | |

FOREIGN PATENT DOCUMENTS

| | | |
|---|---|---|
| CN | 107293570 | 10/2017 |
| CN | 109859625 | 6/2019 |
| CN | 110600509 | 12/2019 |
| CN | 110853517 | 2/2020 |

* cited by examiner

*Primary Examiner* — Shih Tsun A Chou
*Assistant Examiner* — Anthony V. D'Orsaneo

(57) ABSTRACT

An array substrate and a display panel are provided. The display panel has an area for bending, and the array substrate has a bending area corresponding to the area for bending and non-bending areas positioned on both sides of the bending area. The array substrate includes a plurality of driving units and a plurality of first connecting lines. The driving units are disposed in the non-bending areas, the first connecting lines are disposed in the bending area, and each of the first connecting lines is connected to two of the driving units positioned on both sides of each of the first connecting lines.

18 Claims, 6 Drawing Sheets

ARRAY SUBSTRATE AND DISPLAY PANEL

RELATED APPLICATIONS

This application is a National Phase of PCT Patent Application No. PCT/CN2020/105711 having International filing date of Jul. 30, 2020, which claims the benefit of priority of Chinese Patent Application No. 202010631760.8 filed on Jul. 3, 2020. The contents of the above applications are all incorporated by reference as if fully set forth herein in their entirety.

FIELD AND BACKGROUND OF THE INVENTION

The present disclosure relates to the field of display technologies, more particularly, to manufacturing of display devices, and specifically, to an array substrate and a display panel.

Since organic light-emitting diode (OLED) display panels have characteristics of foldability, low energy consumption, and self-illumination, they are gradually developing toward a direction of flexible foldable displays.

However, circuits in foldable areas of OLED flexible display panels may be damaged in a folding process, such as changing electrical properties of the circuits in the foldable areas, or even breaking wirings of the circuits in the foldable areas and causing signals unable to be transmitted normally, thereby causing OLED foldable display panels to have abnormal display images.

Therefore, it is necessary to provide an array substrate and a display panel to improve bendability of the OLED foldable display panels.

Technical problem: an objective of the present disclosure is to provide an array substrate and a display panel. By disposing a plurality of driving units in non-bending areas and disposing a plurality of first connecting lines in a bending area to connect the driving units positioned on both sides of the bending area, the present disclosure solves the problems that current OLED foldable display panels have abnormal display images caused by breaking wirings of the circuits in the foldable areas.

SUMMARY OF THE INVENTION

An embodiment of the present disclosure provides an array substrate, which is applied to a display panel having an area for bending, and has a bending area corresponding to the area for bending and non-bending areas positioned on both sides of the bending area. The array substrate includes:

a plurality of driving units disposed in the non-bending areas;

a plurality of first connecting lines disposed in the bending area, wherein each of the first connecting lines is connected to two of the driving units positioned on both sides of each of the first connecting lines, and each of the first connecting lines is provided with a plurality of openings; and a plurality of second connecting lines positioned in the non-bending areas, wherein each of the second connecting lines is configured to connect the driving units in the non-bending area, and a width of the first connecting lines is greater than a width of the second connecting lines.

In an embodiment of the present disclosure, a distance between two of the first connecting lines adjacent to each other is not less than 3 µm.

In an embodiment of the present disclosure, the display panel has a display area, and the array substrate has a first area corresponding to the display area; and the driving units include a plurality of first pixel driving units disposed in an overlapped area of the first area and the non-bending areas, and the first pixel driving units are configured to drive corresponding first light-emitting units disposed in the area for bending.

In an embodiment of the present disclosure, the driving units further include a plurality of second pixel driving units disposed in the overlapped area of the first area and the non-bending areas, and the second pixel driving units are configured to drive corresponding second light-emitting units disposed in the non-bending areas; and the second connecting lines include a plurality of scanning lines and data lines, each of the scanning lines is connected to the first pixel driving units or the second pixel driving units in a corresponding row, and each of the data lines is connected to the first pixel driving units and the second pixel driving units in a corresponding column.

In an embodiment of the present disclosure, the first connecting lines include:

a plurality of first sub connecting lines disposed in the bending area, and each of the first sub connecting lines is connected to two of the first pixel driving units positioned on both sides of each of the first sub connecting lines.

In an embodiment of the present disclosure, the array substrate further includes a second area surrounding the first area; and the driving units further include a plurality of gate driving units disposed in an overlapped area of the second area and the non-bending areas, and each of the gate driving units is connected to the first pixel driving units or the second pixel driving units in a corresponding row to drive corresponding first light-emitting units or corresponding second light-emitting units.

In an embodiment of the present disclosure, the first connecting lines include:

a plurality of second sub connecting lines disposed in the bending area, and each of the second sub connecting lines is connected to two of the gate driving units positioned on both sides of each of the second sub connecting lines.

An embodiment of the present disclosure provides an array substrate, which is applied to a display panel having an area for bending, and has a bending area corresponding to the area for bending and non-bending areas positioned on both sides of the bending area. The array substrate includes:

a plurality of driving units disposed in the non-bending areas; and a plurality of first connecting lines disposed in the bending area, wherein each of the first connecting lines is connected to two of the driving units positioned on both sides of each of the first connecting lines.

In an embodiment of the present disclosure, the array substrate further includes:

a plurality of second connecting lines positioned in the non-bending areas, wherein each of the second connecting lines is configured to connect the driving units in the non-bending area, and a width of the first connecting lines is greater than a width of the second connecting lines.

In an embodiment of the present disclosure, each of the first connecting lines is provided with a plurality of openings.

In an embodiment of the present disclosure, a distance between two of the first connecting lines adjacent to each other is not less than 3 µm.

In an embodiment of the present disclosure, the display panel has a display area, and the array substrate has a first area corresponding to the display area; and the driving units include a plurality of first pixel driving units disposed in an overlapped area of the first area and the non-bending areas, and the first pixel driving units are configured to drive corresponding first light-emitting units disposed in the area for bending.

In an embodiment of the present disclosure, the driving units further include a plurality of second pixel driving units disposed in the overlapped area of the first area and the non-bending areas, and the second pixel driving units are configured to drive corresponding second light-emitting units disposed in the non-bending areas; and the second connecting lines include a plurality of scanning lines and data lines, each of the scanning lines is connected to the first pixel driving units or the second pixel driving units in a corresponding row, and each of the data lines is connected to the first pixel driving units and the second pixel driving units in a corresponding column.

In an embodiment of the present disclosure, the first connecting lines include:

a plurality of first sub connecting lines disposed in the bending area, and each of the first sub connecting lines is connected to two of the first pixel driving units positioned on both sides of each of the first sub connecting lines.

In an embodiment of the present disclosure, the array substrate further includes a second area surrounding the first area; and the driving units further include a plurality of gate driving units disposed in an overlapped area of the second area and the non-bending areas, and each of the gate driving units is connected to the first pixel driving units or the second pixel driving units in a corresponding row to drive corresponding first light-emitting units or corresponding second light-emitting units.

In an embodiment of the present disclosure, the first connecting lines include:

a plurality of second sub connecting lines disposed in the bending area, and each of the second sub connecting lines is connected to two of the gate driving units positioned on both sides of each of the second sub connecting lines.

An embodiment of the present disclosure also provides a display panel, which includes an array substrate and has an area for bending. Wherein, the array substrate has a bending area corresponding to the area for bending and non-bending areas positioned on both sides of the bending area and includes:

a plurality of driving units disposed in the non-bending areas; and a plurality of first connecting lines disposed in the bending area, wherein each of the first connecting lines is connected to two of the driving units positioned on both sides of each of the first connecting lines.

In an embodiment of the present disclosure, the array substrate further includes:

a plurality of second connecting lines positioned in the non-bending areas, wherein each of the second connecting lines is configured to connect the driving units in the non-bending area, and a width of the first connecting lines is greater than a width of the second connecting lines.

In an embodiment of the present disclosure, the display panel has a display area, and the array substrate has a first area corresponding to the display area; and the driving units include a plurality of first pixel driving units disposed in an overlapped area of the first area and the non-bending areas, and the first pixel driving units are configured to drive corresponding first light-emitting units disposed in the area for bending.

In an embodiment of the present disclosure, the first connecting lines include:

a plurality of first sub connecting lines disposed in the bending area, and each of the first sub connecting lines is connected to two of the first pixel driving units positioned on both sides of each of the first sub connecting lines.

Beneficial effect: the present disclosure provides an array substrate and a display panel. The display panel has an area for bending, and the array substrate has a bending area corresponding to the area for bending and non-bending areas positioned on both sides of the bending area. By disposing a plurality of driving units in the non-bending areas and disposing a plurality of first connecting lines in the bending area to connect every two of the driving units positioned on both sides of the first connecting lines, this solution prevents from disposing more complicated circuits, such as the driving units, in the bending area, thereby reducing a risk of breaking wirings of circuits in foldable areas and improving bendability of OLED foldable display panels.

BRIEF DESCRIPTION OF THE SEVERAL VIEWS OF THE DRAWINGS

The present disclosure will be further described with the accompanying drawings. It should be noted that the accompanying figures described below are only part of the embodiments of the present disclosure, from which those skilled in the art can derive further figures without making any inventive efforts.

DESCRIPTION OF SPECIFIC EMBODIMENTS OF THE INVENTION

Figure 1:
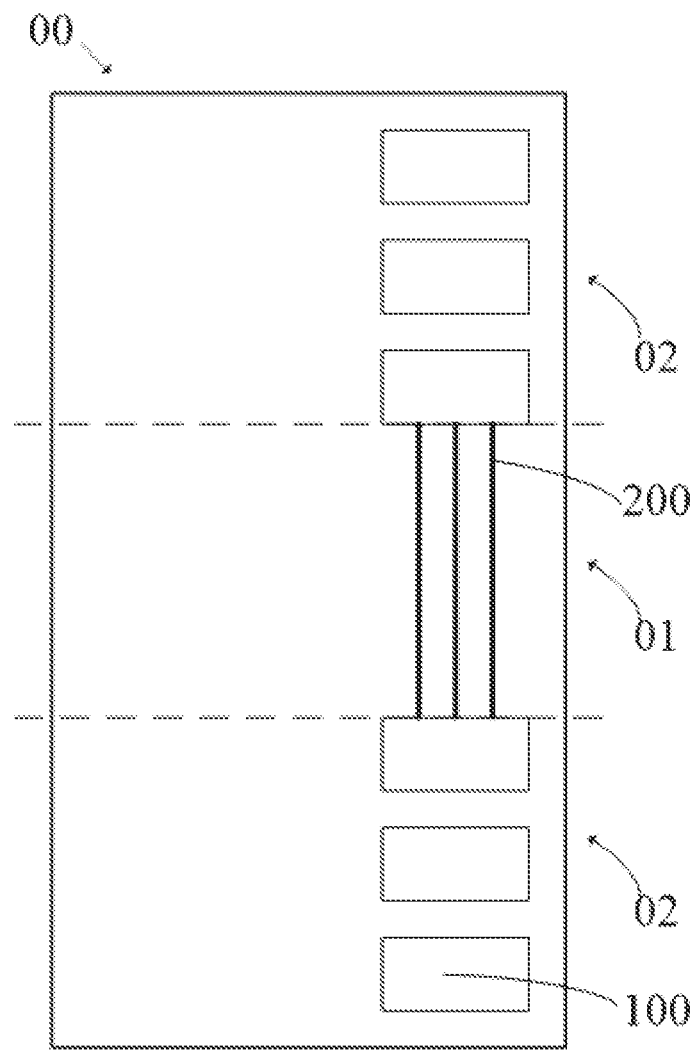
FIG. 1 is a schematic top view of a first array substrate according to an embodiment of the present disclosure.

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative efforts are within the scope of the present disclosure.

In addition, in the description of the present disclosure, it should be understood that terms such as "on", "under", "surrounding", "adjacent", as well as derivative thereof should be construed to refer to the orientation as described or as shown in the drawings under discussion. For example, "on" only refers to a surface above an object, and specifically refers to directly above, obliquely above, or an upper surface, as long as it is above the level of the object; and "adjacent" refers to one of two sides of the object in the figures, which is closer to another object. These relative terms are for convenience of description, do not require that the present disclosure be constructed or operated in a particular orientation, and shall not be construed as causing limitations to the present disclosure.

In addition, it should be noted that the drawings only provide structures that are relatively closely related to the present disclosure, and omit some details that are not relevant to the present disclosure. The purpose is to simplify the drawings so that the application points are clear, rather than showing the actual device is exactly the same as the figures, and the drawings do not cause limitations to the actual device.

The present disclosure provides an array substrate, which includes, but is not limited to, following embodiments. The array substrate is applied to a display panel.

In an embodiment, as shown in FIG. 1, the display panel has an area for bending, and the array substrate 00 has a bending area 01 corresponding to the area for bending and non-bending areas 02 positioned on both sides of the bending area 01. The array substrate 00 includes: a plurality of driving units 100 disposed in the non-bending areas 02; and a plurality of first connecting lines 200 disposed in the bending area 01, wherein each of the first connecting lines 200 is connected to two of the driving units 100 positioned on both sides of each of the first connecting lines 200.

In an embodiment, the array substrate 00 further includes a plurality of second connecting lines positioned in the non-bending areas 02, the second connecting lines are configured to connect the driving units 100 in the non-bending area 02, and a width of the first connecting lines 200 is greater than a width of the second connecting lines. It should be understood that when the first connecting lines 200 in the bending area 01 are bent, if the width of the first connecting lines 200 is greater, a pressure on the first connecting lines 200 per unit area is lower, and the first connecting lines 200 are less likely to be broken.

Further, when the first connecting lines 200 have a constant width, a contour of the first connecting lines 200 may be manufactured as a curved shape. Similarly, in one aspect, an area of the first connecting lines 200 can be increased by increasing a length of the first connecting lines 200, so the pressure on the first connecting lines 200 per unit area can be lower, and the first connecting lines 200 are less likely to be broken. In another aspect, a degree of dispersion of the first connecting lines 200 can be increased by increasing a contour length of the first connecting lines 200, thereby improving bendability of the first connecting lines 200.

In an embodiment of the present disclosure, a distance between two of the first connecting lines 200 adjacent to each other is not less than 3 μm. It can be understood that since the width of the first connecting lines 200 is greater, the distance between the two of the first connecting lines 200 adjacent to each other may be shorter. Short circuits between the two of the first connecting lines 200 adjacent to each other, which cause signal transmission errors, can be effectively prevented by limiting the distance between the two of the first connecting lines 200 adjacent to each other not less than 3 μm.

Figure 2:
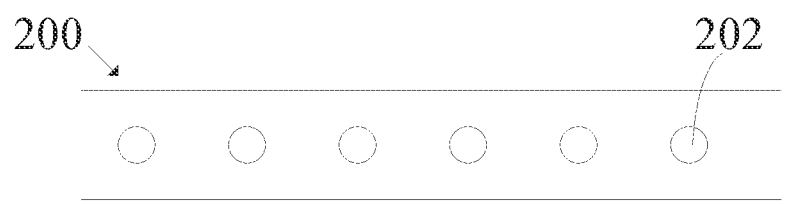
FIG. 2 is a schematic top view of a first connecting line according to an embodiment of the present disclosure.
Figure 3:
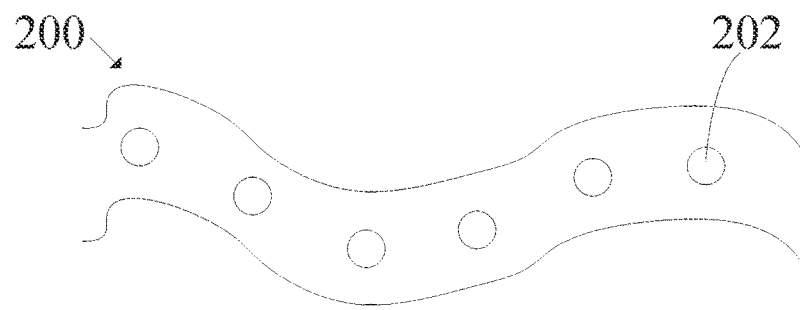
FIG. 3 is a schematic top view of another first connecting line according to an embodiment of the present disclosure.

In an embodiment of the present disclosure, as shown in FIGS. 2 and 3, each of the first connecting lines 200 is provided with a plurality of openings 202. In one aspect, an arrangement path of the openings 202 on each of the first connecting lines 200 may coincide with the contour shape of the first connecting lines 200. For example, as shown in FIG. 2, the contour of each of the first connecting lines 200 is a straight shape, and the openings 202 are arranged as a straight path along the contour shape of the first connecting lines 200; and for another example, as shown in FIG. 3, the contour of each of the first connecting lines 200 is a curved shape, and the openings 202 are arranged as a curved path along the contour shape of the first connecting lines 200. In another aspect, shapes or sizes of the openings 202 on each of the first connecting lines 200 may be same or different, and the shapes of the openings 202 may be circular, triangular, rectangular, or other shapes. In yet another aspect, a number and an arrangement spacing of the openings 202 on each of the first connecting lines 200 may be set according to sizes and materials of the first connecting lines 200.

It can be understood that since the first connecting lines 200 are provided with the openings 202, when the first connecting lines 200 are subjected to a force and bent, if somewhere is broken, the openings 202 can prevent cracks at the break from extending toward both sides or one of the both sides, thereby reducing a risk of disconnecting the first connecting lines 200.

Figure 4:
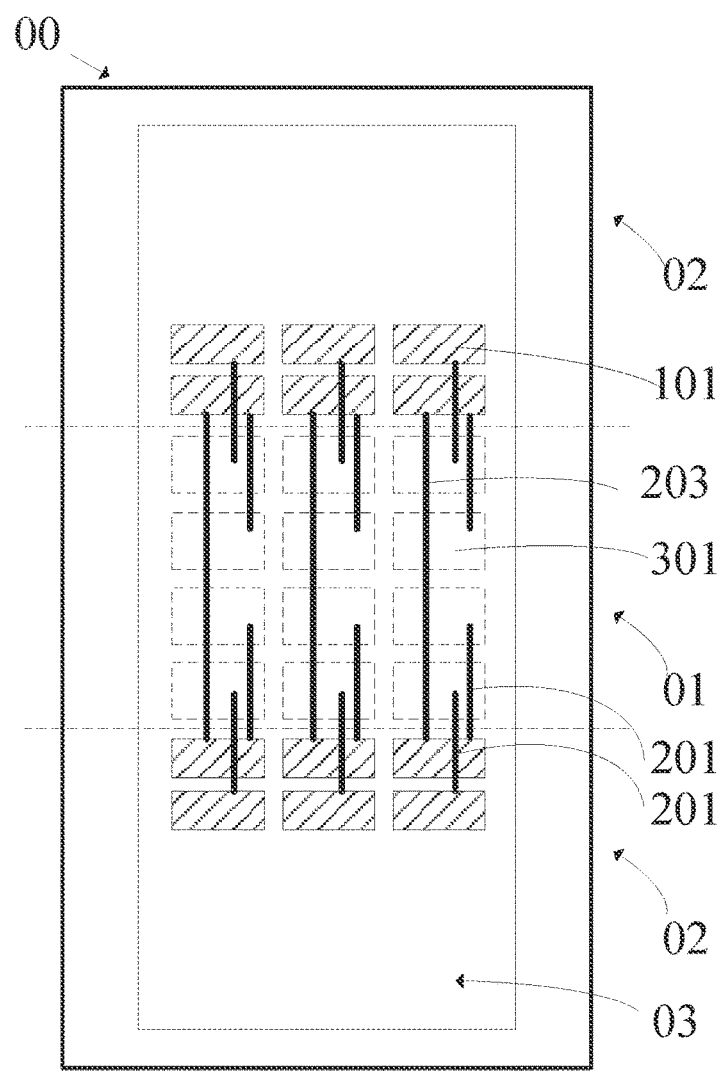
FIG. 4 is a schematic top view of a second array substrate according to an embodiment of the present disclosure.

In an embodiment of the present disclosure, as shown in FIG. 4, the display panel has a display area, and the array substrate 00 has a first area 03 corresponding to the display area. The driving units 100 include a plurality of first pixel driving units 101 disposed in an overlapped area of the first area 03 and the non-bending areas 02, each of the first pixel driving units 101 is configured to drive corresponding first light-emitting units 301, and the first light-emitting units 301 are all disposed in the bending area 01.

Further, the first light-emitting units 301 are disposed on the array substrate 00 and in an area corresponding to the bending area 01 and the first area 03. It can be understood that since the first light-emitting units 301 are disposed in the area for bending 01, in order to facilitate driving the corresponding first light-emitting units 301, the first pixel driving units 101 can be disposed in the overlapped area of the first area 03 and the non-bending areas 02, which is an area more adjacent to the bending area 01.

In an embodiment of the present disclosure, as shown in FIG. 4, the first connecting lines 200 include a plurality of first sub connecting lines 203 disposed in the bending area 01, and each of the first sub connecting lines 203 is connected to two of the first pixel driving units 101 positioned on both sides of each of the first sub connecting lines 203. It can be understood that since the first sub connecting lines 203 are disposed in the bending area 01, in order to increase a bending resistance of the first sub connecting lines 203, a setting method of the first sub connecting lines 203 can be referred to related description of the first connecting lines 200 mentioned above.

In an embodiment of the present disclosure, as shown in FIG. 4, the array substrate 00 includes a plurality of connecting lines 201, each of the connecting lines 201 connects one of the first pixel driving units 101 to one of the corresponding first light-emitting units 301, the connecting lines 201 include sub connecting lines disposed in the bending area 01, and a width of the sub connecting lines is greater than the width of the second connecting lines.

In an embodiment of the present disclosure, each of the sub connecting lines is provided with a plurality of openings, and related description of the sub connecting lines can be referred to related description of the first connecting lines 200 mentioned above.

Figure 5:
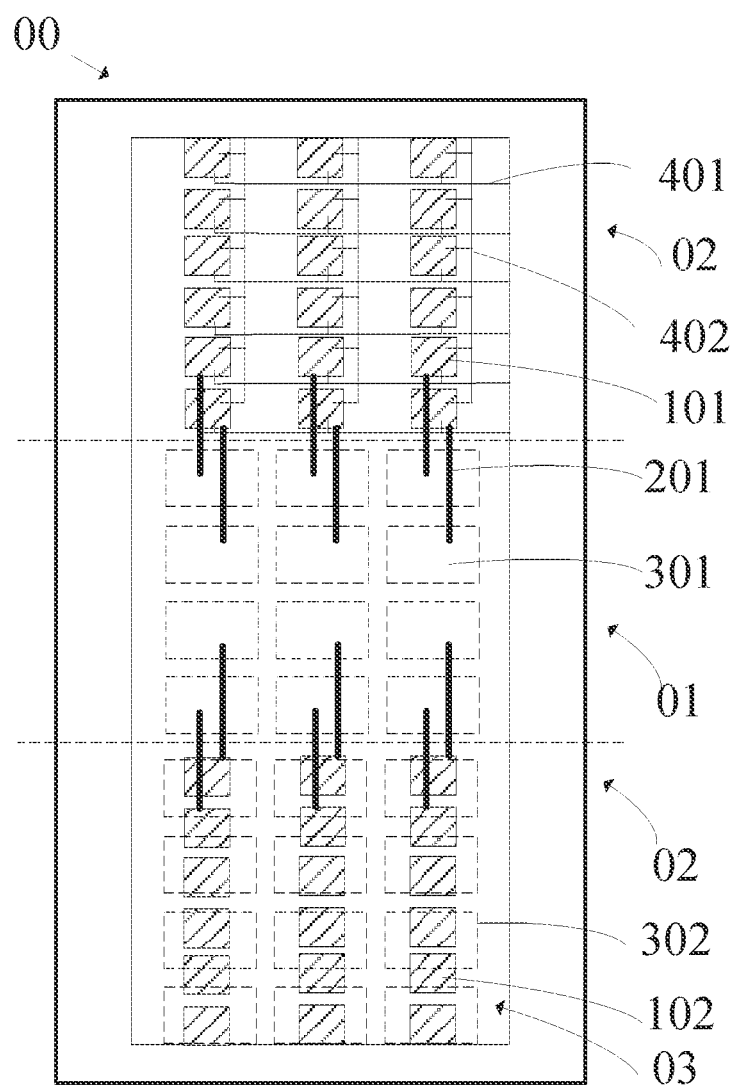
FIG. 5 is a schematic top view of a third array substrate according to an embodiment of the present disclosure.

In an embodiment of the present disclosure, as shown in FIG. 5, the driving units 100 further include a plurality of second pixel driving units 102 disposed in the overlapped area of the first area 03 and the non-bending areas 02, each of the second pixel driving units 102 is configured to drive corresponding second light-emitting units 302, and the second light-emitting units 302 are disposed in the non-bending areas 02 (only a distribution of the second light-emitting units 302 in the first area 03 on a lower side is marked here). The second connecting lines include scanning lines 401 and data lines 402, each of the scanning lines 401 is connected to the first pixel driving units 101 or the second pixel driving units 102 in a corresponding row, and each of the data lines 402 is connected to the first pixel driving units 101 and the second pixel driving units 102 in a corresponding column (only a distribution of the canning lines 401 and the data lines 402 on an upper side is marked here).

In addition, the second connecting lines further include EM lines and VDD lines. Specifically, the EM lines are in parallel to and disposed alternatingly with the scanning lines 401, and EM signals are used to control light-emitting units in a corresponding column. Further, each of the EM lines can be connected to the first pixel driving units 101 and/or the second pixel driving units 102 in one or two corresponding rows. The VDD lines are in parallel to and disposed alternatingly with the data lines 402, and the VDD lines transmit voltage signals used to provide operating voltages for corresponding switch elements. Further, each of the VDD lines can be connected to the first pixel driving units 101 and the second pixel driving units 102 in one corresponding column.

Wherein, the scanning lines 401 and the EM lines may be a single metal layer manufactured by molybdenum, and the data lines 402 and the VDD lines may be a composite metal layer manufactured by "titanium-aluminum-titanium".

Further, the second light-emitting units 302 are disposed on the array substrate 00 and in an area corresponding to the non-bending area 02 and the first area 03. Wherein, the first light-emitting units 301 disposed opposite to the bending area 01 and the second light-emitting units 302 disposed opposite to the non-bending area 02 together constitute all the light-emitting units to display images. It can be understood that since the first pixel driving units 101 and the second pixel driving units 102 are only disposed in the non-bending area 02 and the first light-emitting units 301 and the second light-emitting units 302 are uniformly disposed in the first area 03, compared to current technology, a distribution density of the first pixel driving units 101 and the second pixel driving units 102 is greater.

Wherein, the first pixel driving units 101 and the second pixel driving units 102 may be uniformly distributed in the overlapped area of the first area 03 and the non-bending areas 02 with a same density and a same arrangement without distinction; or an arrangement density of the first pixel driving units 101 may be greater than an arrangement density of the second pixel driving units 102 to facilitate connections between each light-emitting unit and corresponding pixel driving units.

Figure 6:
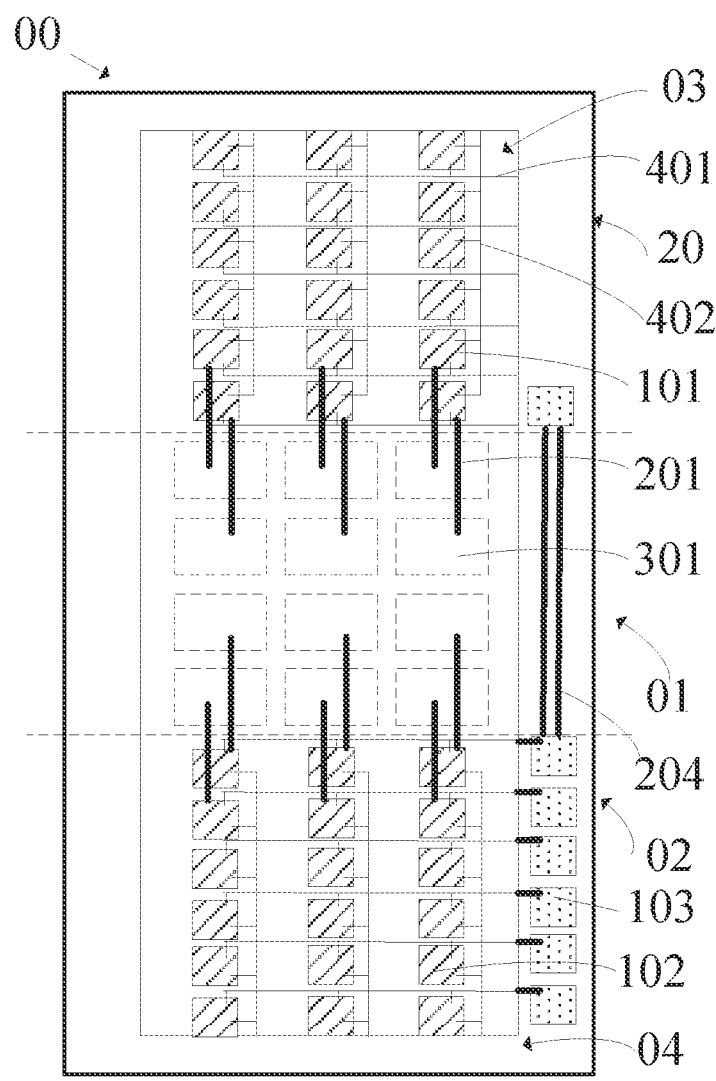
FIG. 6 is a schematic top view of a fourth array substrate according to an embodiment of the present disclosure.
Figure 7:
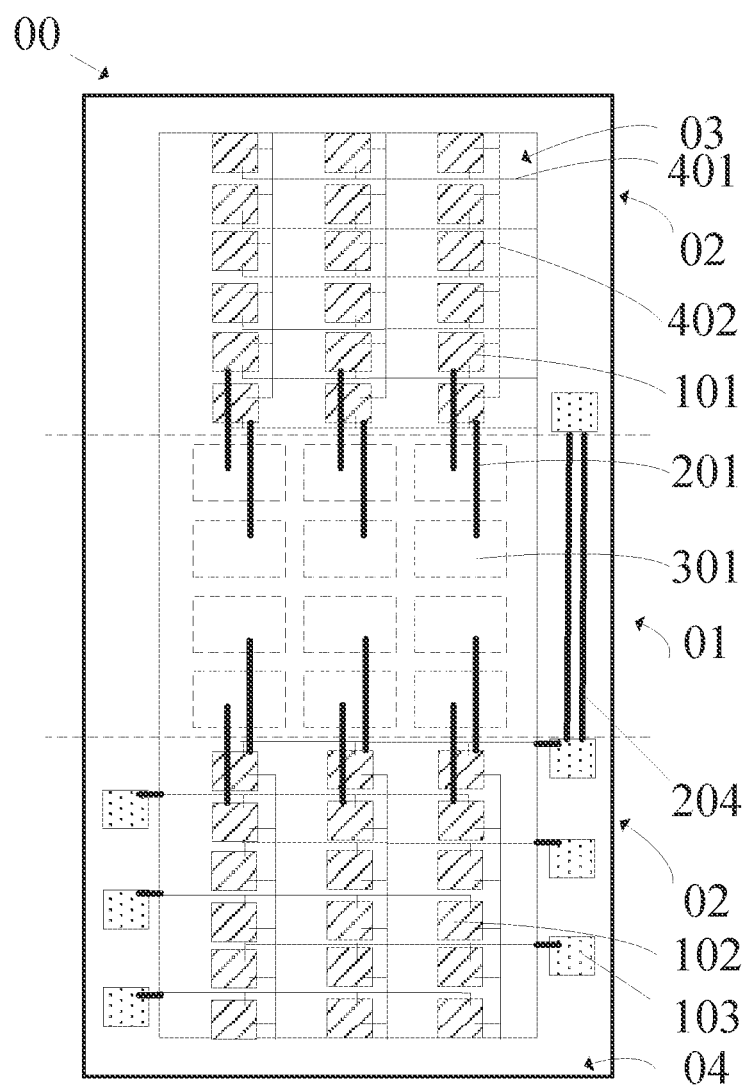
FIG. 7 is a schematic top view of a fifth array substrate according to an embodiment of the present disclosure.
Figure 8:
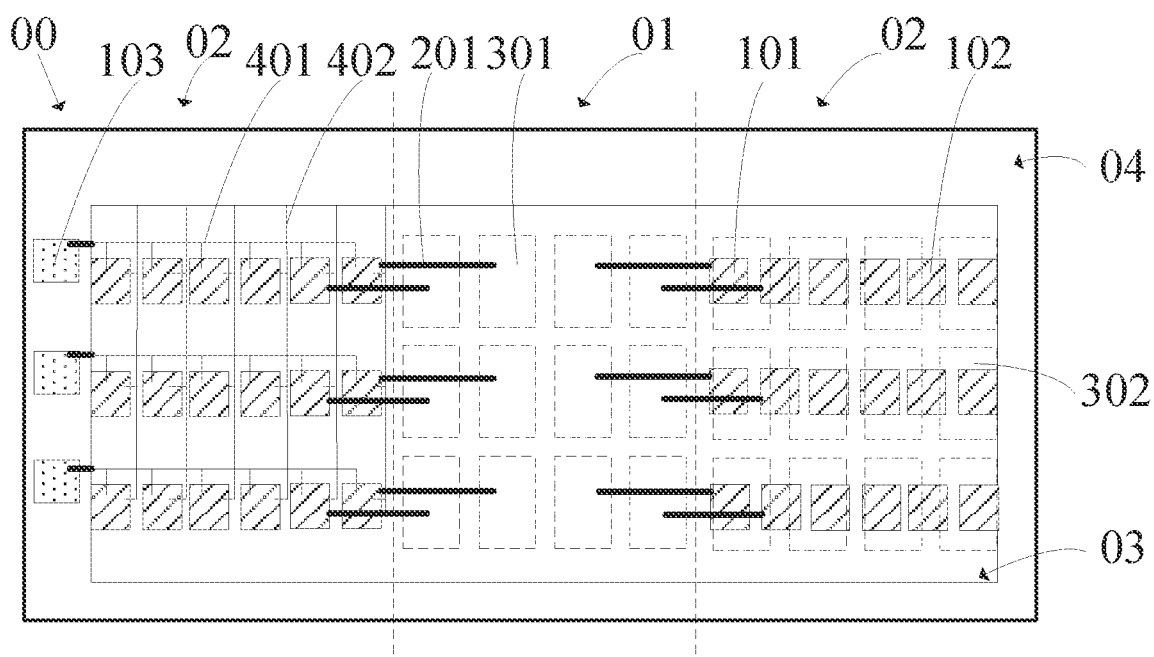
FIG. 8 is a schematic top view of a sixth array substrate according to an embodiment of the present disclosure.

In an embodiment of the present disclosure, as shown in FIGS. 6 to 8, the array substrate 00 further includes a second area 04 surrounding the first area 03. The driving units 100 further include a plurality of gate driving units 103 disposed in an overlapped area of the second area 04 and the non-bending areas 02, and each of the gate driving units 103 is connected to the first pixel driving units 101 or the second pixel driving units 102 in a corresponding row to drive corresponding first light-emitting units 301 or corresponding second light-emitting units 302.

It can be understood that as shown in FIGS. 6 and 7, when the bending area 01 is perpendicular to a left boundary or a right boundary of the array substrate 00, since the scanning lines 401 extend along a row direction and are arranged along a column direction, and each of the gate driving units 103 is connected to one corresponding scanning line 401, the gate driving units 103 should be also arranged along the column direction (only a distribution of the gate driving units 103 in the second area 04 on a lower side is marked here), and it is necessary to consider setting the gate driving units 103 in a way to avoid the bending area 01. For example, as shown in FIG. 6, the gate driving units 103 may disposed on a right side of the display area 03, and further, the gate driving units 103 are disposed corresponding to the scanning lines 401 by one-to-one, and a distribution density is kept consistent. Further, when each of the gate driving units 103 has a greater area, in order to prevent interference between adjacent gate driving units 103, for example, as shown in FIG. 7, the gate driving units 103 can be disposed on a left side and the right side of the display area 03. For example, the gate driving units 103 disposed on the right side of the display area 03 are connected to the scanning lines 401 in corresponding odd columns, and the gate driving units 103 disposed on the left side of the display area 03 are connected to the scanning lines 401 in corresponding even columns.

In an embodiment of the present disclosure, as shown in FIGS. 6 and 7, the first connecting lines 200 include second sub connecting lines 204 disposed in the bending area 01, and each of the second sub connecting lines 204 is connected to two of the gate driving units 103 positioned on both sides of each of the second sub connecting lines 204. It can be understood that since the second sub connecting lines 204 are disposed in the bending area 01, in order to increase a bending resistance of the second sub connecting lines 204, a setting method of the second sub connecting lines 204 can be referred to related description of the first connecting lines 200 mentioned above.

It should be noted that the second sub connecting lines 204 and a plurality of connecting lines between any two adjacent gate driving units 103 in any one of the non-bending areas 02 may individually include lines used to transmit first clock signals, second clock signals, positive voltage signals, negative voltage signals, and previous stage input signals, and a only difference is that a line shape of the second sub connecting lines 204 is different from a line shape of the lines between any two adjacent gate driving units 103 in any one of the non-bending areas 02. Wherein, the first clock signals and the second clock signals can be used to synchronize the gate driving units 103, the positive voltage signals and the negative voltage signals can be used to provide the positive voltage signals and the negative voltage signals to the gate driving units 103, and the previous stage input signals can represent output signals of the gate driving units 103 of a previous stage and input signals of the gate driving units 103 of a current stage.

It should be noted that as shown in FIG. 8, when the bending area 01 is in parallel to the left boundary or the right boundary of the array substrate 00, since the scanning lines 401 extend along the row direction and are arranged along the column direction, and each of the gate driving units 103 is connected to one corresponding scanning line 401, the gate driving units 103 should be also arranged along the column direction (only a distribution of the gate driving units 103 in the second area 04 on a left side is marked here). It can be known from FIG. 7, the gate driving units 103 are disposed on the left side and/or the right side of the array substrate 00, and it is not necessary to consider setting the gate driving units 103 in a way to avoid the bending area 01. In addition, a number of the gate driving units 103 on the left side and/or the right side of the array substrate 00 in the column direction is same as a number of all the pixel driving units in the column direction, so distribution densities of the gate driving units 103 and the pixel driving units in the column direction can be same.

The present disclosure provides the array substrate and the display panel. The display panel has the area for bending, and the array substrate has the bending area corresponding to the area for bending and the non-bending areas positioned on both sides of the bending area. By disposing the plurality of driving units in the non-bending areas and disposing the plurality of first connecting lines in the bending area to connect every two of the driving units positioned on both sides of the first connecting lines, this solution prevents from disposing more complicated circuits, such as the driving units, in the bending area, thereby reducing a risk of breaking wirings of circuits in foldable areas and improving bendability of OLED foldable display panels.

Structures of the array substrate and the display panel provided by the present disclosure are described in detail above. The specific examples are applied in the description to explain the principle and implementation of the disclosure. The description of the above embodiments is only for helping to understand the technical solution of the present disclosure and its core ideas, and it is understood that many changes and modifications to the described embodiment can be carried out without departing from the scope and the spirit of the disclosure that is intended to be limited only by the appended claims.

What is claimed is:

1. An array substrate, applied to a display panel having an area for bending, having a bending area corresponding to the area for bending and non-bending areas positioned on both sides of the bending area, and comprising:
   a plurality of driving units disposed in the non-bending areas;
   a plurality of first connecting lines disposed in the bending area, wherein each of the first connecting lines is connected to two of the driving units positioned on both sides of each of the first connecting lines, and each of the first connecting lines is provided with a plurality of openings; and
   a plurality of second connecting lines positioned in the non-bending areas, wherein each of the second connecting lines is configured to connect the driving units in the non-bending area, and a width of the first connecting lines is greater than a width of the second connecting lines.

2. The array substrate according to claim 1, wherein a distance between two of the first connecting lines adjacent to each other is not less than 3 μm.

3. The array substrate according to claim 1, wherein the display panel has a display area, and the array substrate has a first area corresponding to the display area; and
   the driving units comprise a plurality of first pixel driving units disposed in an overlapped area of the first area and the non-bending areas, and the first pixel driving units are configured to drive corresponding first light-emitting units disposed in the area for bending.

4. The array substrate according to claim 3, wherein the driving units further comprise a plurality of second pixel driving units disposed in the overlapped area of the first area and the non-bending areas, and the second pixel driving units are configured to drive corresponding second light-emitting units disposed in the non-bending areas; and
   the second connecting lines comprise a plurality of scanning lines and data lines, each of the scanning lines is connected to the first pixel driving units or the second pixel driving units in a corresponding row, and each of the data lines is connected to the first pixel driving units and the second pixel driving units in a corresponding column.

5. The array substrate according to claim 3, wherein the first connecting lines comprise a plurality of first sub connecting lines disposed in the bending area, and each of the first sub connecting lines is connected to two of the first pixel driving units positioned on both sides of each of the first sub connecting lines.

6. The array substrate according to claim 3, further comprising a second area surrounding the first area; and
   the driving units further comprise a plurality of gate driving units disposed in an overlapped area of the second area and the non-bending areas, and each of the gate driving units is connected to the first pixel driving units or the second pixel driving units in a corresponding row to drive corresponding first light-emitting units or corresponding second light-emitting units.

7. The array substrate according to claim 6, wherein the first connecting lines comprise a plurality of second sub connecting lines disposed in the bending area, and each of the second sub connecting lines is connected to two of the gate driving units positioned on both sides of each of the second sub connecting lines.

8. An array substrate, applied to a display panel having an area for bending, having a bending area corresponding to the area for bending and non-bending areas positioned on both sides of the bending area, and comprising:
   a plurality of driving units disposed in the non-bending areas;
   a plurality of first connecting lines disposed in the bending area, wherein each of the first connecting lines is connected to two of the driving units positioned on both sides of each of the first connecting lines; and
   a plurality of second connecting lines positioned in the non-bending areas, wherein each of the second connecting lines is configured to connect the driving units in the non-bending area, and a width of the first connecting lines is greater than a width of the second connecting lines.

9. The array substrate according to claim 8, wherein each of the first connecting lines is provided with a plurality of openings.

10. The array substrate according to claim 8, wherein a distance between two of the first connecting lines adjacent to each other is not less than 3 μm.

11. The array substrate according to claim 8, wherein the display panel has a display area, and the array substrate has a first area corresponding to the display area; and
   the driving units comprise a plurality of first pixel driving units disposed in an overlapped area of the first area and the non-bending areas, and the first pixel driving units are configured to drive corresponding first light-emitting units disposed in the area for bending.

12. The array substrate according to claim 11, wherein the driving units further comprise a plurality of second pixel driving units disposed in the overlapped area of the first area and the non-bending areas, and the second pixel driving units are configured to drive corresponding second light-emitting units disposed in the non-bending areas; and
   the second connecting lines comprise a plurality of scanning lines and data lines, each of the scanning lines is connected to the first pixel driving units or the second pixel driving units in a corresponding row, and each of the data lines is connected to the first pixel driving units and the second pixel driving units in a corresponding column.

13. The array substrate according to claim 11, wherein the first connecting lines comprise a plurality of first sub connecting lines disposed in the bending area, and each of the first sub connecting lines is connected to two of the first pixel driving units positioned on both sides of each of the first sub connecting lines.

14. The array substrate according to claim 11, further comprising a second area surrounding the first area; and
the driving units further comprise a plurality of gate driving units disposed in an overlapped area of the second area and the non-bending areas, and each of the gate driving units is connected to the first pixel driving units or the second pixel driving units in a corresponding row to drive corresponding first light-emitting units or corresponding second light-emitting units.

15. The array substrate according to claim 14, wherein the first connecting lines comprise a plurality of second sub connecting lines disposed in the bending area, and each of the second sub connecting lines is connected to two of the gate driving units positioned on both sides of each of the second sub connecting lines.

16. A display panel, comprising an array substrate and having an area for bending, wherein the array substrate has a bending area corresponding to the area for bending and non-bending areas positioned on both sides of the bending area and comprises:

a plurality of driving units disposed in the non-bending areas;
a plurality of first connecting lines disposed in the bending area, wherein each of the first connecting lines is connected to two of the driving units positioned on both sides of each of the first connecting lines; and
a plurality of second connecting lines positioned in the non-bending areas, wherein each of the second connecting lines is configured to connect the driving units in the non-bending area, and a width of the first connecting lines is greater than a width of the second connecting lines.

17. The display panel according to claim 16, having a display area, wherein the array substrate has a first area corresponding to the display area; and
the driving units comprise a plurality of first pixel driving units disposed in an overlapped area of the first area and the non-bending areas, and the first pixel driving units are configured to drive corresponding first light-emitting units disposed in the area for bending.

18. The display panel according to claim 17, wherein the first connecting lines comprise a plurality of first sub connecting lines disposed in the bending area, and each of the first sub connecting lines is connected to two of the first pixel driving units positioned on both sides of each of the first sub connecting lines.

* * * * *